United States Patent [19]

Chang

[11] Patent Number: 4,810,662
[45] Date of Patent: Mar. 7, 1989

[54] METHOD OF FABRICATING A SI/SIC AMORPHOUS HETEROJUNCTION PHOTO TRANSISTOR

[75] Inventor: Chun-Yen Chang, Tainan, Taiwan

[73] Assignee: National Science Council, Taipei, Taiwan

[21] Appl. No.: 97,042

[22] Filed: Sep. 16, 1987

[51] Int. Cl.⁴ .......................................... H01L 31/18
[52] U.S. Cl. ........................................ 437/4; 357/30; 437/3
[58] Field of Search ............... 437/3, 4; 357/30 P, 357/30 K

[56] References Cited

FOREIGN PATENT DOCUMENTS 58-139464  8/1983  Japan ................. 357/30 K

Primary Examiner—Aaron Weisstuch
Attorney, Agent, or Firm—Spencer & Frank

[57] ABSTRACT

A heterojunction amorphous $SiC/S_i$ phototransistor with the structure of Al/n+ a-SiC/i a-SiC/p+ a-SiC/i a-Si/n+ a-SiC is provided. This new device has a very thin a-SiC base (100Å) and a-SiC emitter, which provides an effective barrier to accumulate more photo generated holes at the base and therefore improves the gain significantly. An optical gain of 40 was obtained at an incident power of 5 μw. This device has very promising applications as a flat panel display transistor, a phototransistor in photosensing element/array, and photo coupler to replace the p-i-n photodiode.

6 Claims, 3 Drawing Sheets

METHOD OF FABRICATING A SI/SIC AMORPHOUS HETEROJUNCTION PHOTO TRANSISTOR

BACKGROUND AND SUMMARY OF THE INVENTION

It has been demonstrated that hydrogenated amorphous semiconductors is very useful in making various kinds of photo-sensing and detecting devices.

For photo-sensing and detecting purpose, it is necessary that the device should possess high sensitivity, short switching time, wavelength selectivity, high gain and high speed.

Recently, we have successfully fabricated an amorphous silicon homojunction bulk barrier phototransistor, with high gain ($\sim$12) and high speed ($\sim$30 $\mu$s), but the functioning of the kind of phototransistors mentioned above is not enough. We need more efficient phototransistors to improve the efficiency of photo-sensing and detecting devices.

In order to improve the device performance, a new type of amorphous heterojuction phototransistor with the structure of ITO/n+(a-$S_iC$)/n-i-p(a-$S_iC$)/i-n+(a-$S_i$)/Al is successfully fabricated by the plasma decomposition of an $[(1-X)S_iH_4+XCH_4]$ gas mixture.

A heterojunction phototransistor with large bandgap at the emitter potentially possesses higher gain than a homojunction device, due to a carrier accumulation effect at the emitter-base junction, in which we have adopted a-$S_iC$: H as a wide bandgap material.

This new phototransistor structure has a very thin a-$S_iC$ base (100 Å), and a-$S_iC$ emitter which provide an effective barrier to accumulate more photo-generated holes at the base and therefore significantly improve the gain.

BRIEF DESCRIPTION OF THE DRAWINGS

FIG. 2-1: A band diagram of the amorphous heterojunction phototransistor under dark (equilibrium) conditions.

FIG. 2-2: A band diagram of the amorphous heterojunction phototransistor under illumination (non-equilibrium) conditions.

FIG. 5-1: Dependence of the optical gain on incident power level.

FIG. 5-2: Optical gain of the phototransistor vs. collector current.

DETAILED DESCRIPTION OF THE INVENTION

A heterojunction amorphous $S_i$-$S_iC$ barrier transistor (a-HJBT) is sucessfully fabricated which possesses high gain ($\sim$40) and high speed ($\sim$10 $\mu$s).

It is better than the gain ($\sim$12) and speed ($\sim$30 $\mu$s) of the homojunction amorphous silicon bulk barrier phototransistor as a photosensing device.

A significant improvement has been achieved by making a heterojunction structure between the emitter and the base by a structure of n+($S_i$)/n-i-$\delta$p+($S_iC$) which is in contact with the i-n+(Si) collector layers. The structure is successfully made by plasma enhanced chemical vapor deposition (PECVD) on a glass substrate. The fabrication proceses are as follows:

An ITO coated glass plate with sheet resistance of 50$\Omega$/□ is used as the substrate. After a substrate cleaning process, the sample is placed in the plasma enhanced CVD reactor. Before the deposition of the amorphous film, the substrate temperature is kept at 250° C. for 60 min.

First, a thin n-type a-$S_iC$: H layer of 100 Å thickness is deposited as collector, followed by a undoped a-$S_i$: H layer of 2000–7000 Å thickness.

Next, a 100 Å thick p-type a-$S_iC$: H layer as the base is grown. Then, a 160 Å thick undoped layer and a 300 Å thick n-type a-$S_iC$: H layer are grown as the emitter. In order to grow the a-$S_iC$:H films, a $S_iH_4$ (0.45)+$CH_4$(0.55) gas mixture (volume fraction) is employed with $PH_3$ or $B_2H_6$ as doping gas, and the R.F. power is 30 W. For a-$S_i$: H film deposition, diluted silane gas (75-percent $H_2$+25-percent $S_iH_4$) is used, and the R.F. power is 40 W. During the deposition period the chamber pressure is 1 torr. A cross-section view of the new device is shown in FIG. 1.

Figure 1:
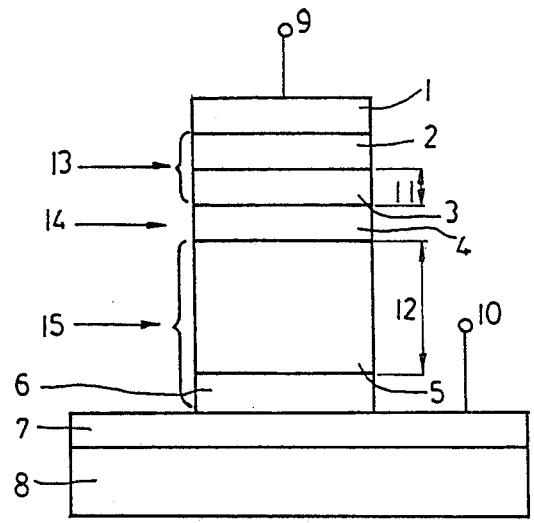
FIG. 1: A schematic cross-section view of the new device.

The series of reference numerals 1 to 8 in FIG. 1 stand for Al, n$^{30}$a-$S_iC$, i a-$S_iC$, p+a-$S_iC$, i a-$S_i$, N+a-$S_iC$, ITO, and glass, respectively. In FIG. 1, 9 and 10 represent the electrode ends of emitter 13 and collector 15 respectively. The thickness of i a-$S_iC$ Layer 3 is shown by 11 and the thickness of i a-$S_i$ layer 5 is shown by 12. Symbols $d_1$ and $d_2$ are other expressions for 11 and 12, respectively. Reference numeral 14 indicates the base.

The amorphous heterojunction phototransistor is similar to the a-$S_i$ homojunction bulk barrier phototransistor, which is a kind of majority carrier device.

Amplification of the photocurrent is achieved due to a photo carrier (minority) induced barrier lowering at the base which in turn induces more carrier (majority) injection from the emitter to the base.

In order to get high current gain, the device is designed in such a way that both sides of the undoped i-layer and the base region are completely depleted of free carriers at any bias condition.

Photogenerated holes accumulated at the barrier valley (base) produce a barrier lowering. This in turn induces a large amount of electron injection over the barrier which results in an increase of the collector current.

Thus a triangular barrier is formed between emitter and collector. Normally, the device is operated with the collector electrode biased positively with respect to the emitter electrode, defined as normal operation, and it is irradiated through the collector side by the light beam.

Figures 1, 2:
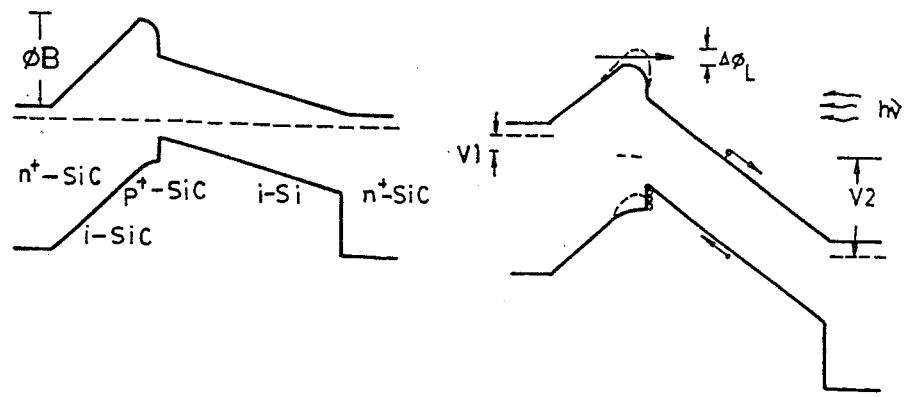

The energy band diagram of the heterojunction transistor is given in FIG. 2-1 and FIG. 2-2 for dark (equilibrium) and illumination (non-equilibrium) conditions, respectively.

Figure 3:
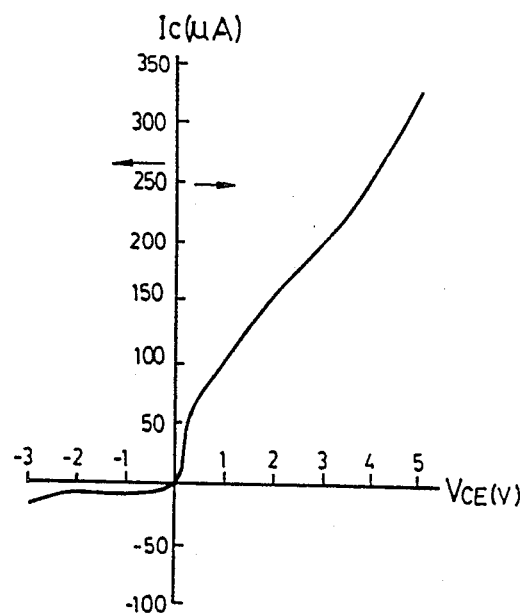
FIG. 3: Typical photo I/V characteristics of the phototransistor.

The typical current-voltage curve under illumination for a phototransistor with collector-base undoped i-layer of 7000 Å is given in FIG. 3. The right side of the $I_c$ line is under normal operation conditons, and the other side is under reverse operation conditions.

Figure 4:
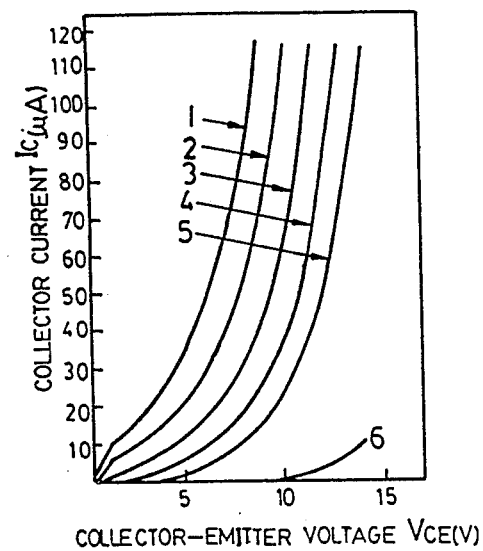
FIG. 4: I/V characteristics of the amorphous heterojuction phototransistor at various incident power levels.

It is shown that normal operation has a much larger output current than reverse operation, due to mechanisms of current amplification. In order to study the photo I/V characteristics under illumination, a He-Ne laser with $\lambda$=6328 Å is used as a signal source, and a Tektronix 177 oscilloscope is used to measure the response of the phototransistor. The laser beam intensity is changed by a variable beam spliter. The graph of the I/V characteristics as a function of incident power is shown in FIG. 4. The curves 1,2,3,4,5, and 6 shown in FIG. 4 indicate incident power conditions of 200 μW, 100 μW, 41.6 μW, 20 μW, 5 μW and 0 μW, respectively.

Figures 1, 5:
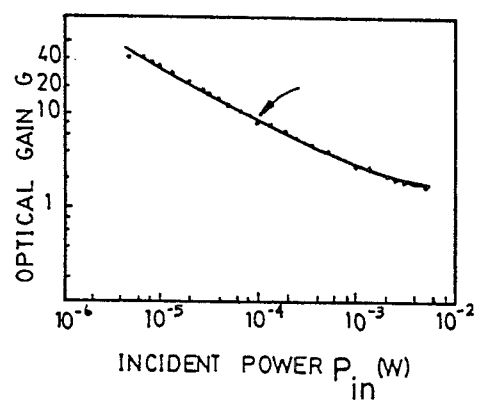
Figures 2, 5:
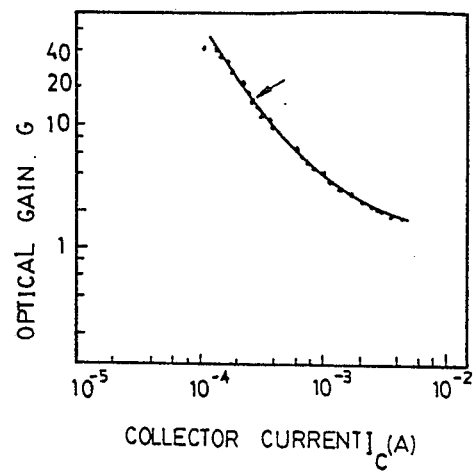

As can be seen, the I/V response of the amorphous heterojunction phototransistor is similar to that of the prior device, except for the strong dependence on bias voltage. For a phototransistor, the optical gain G is the most meritorious parameter and is the prime consideration in device design and fabrication, and can be calculated by $G=(I_c/q)/(P_{in}/h\nu)$, where $I_c$ is the collector current, $P_{in}$ is the incident light power, $h\nu$ is the photon energy, and q is the electronic charge. A plot of G as a function of $P_{in}$ at a bias of 14 V is shown in FIG. 5-1. The conditions of FIG. 5-1 are $1.41\times10^{-2}$ cm$^2$ area and d equal to 3000 Å.

As shown in this figure, G increases with decreasing incident power, which is a unique feature of a majority-carrier photo-detector. An optical gain of 40 is obtained at an incident power of 5 μW, and this is the highest gain reported so far. Even when compared to a crystalline phototransistor, this high gain is even superior to some heterojunction phototransistors made of III-V alloys by MBE (molecular Beam Epitaxy). Capasso et al. reported an optical gain smaller than one, and Chen et al. reported a maximum gain of 10 at 500 μW irradiance. FIG. 5-2 is a graph of optical gain versus collector current. FIG. 5-2 is for an area equal to $1.41\times10^{-2}$cm$^2$, incident power equal to 5 μW and $d_2$ equal to 3000 Å. The point indicated by the arrow in both FIG. 5-1 and FIG. 5-2 is for a collector-emitter voltage of 14 V.

Figure 6:
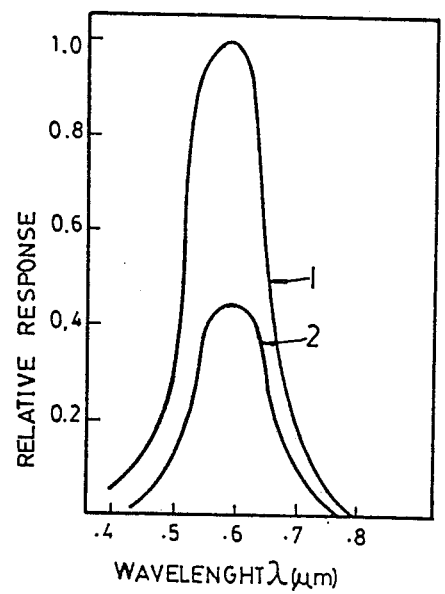
FIG. 6: Relative spectral response of the new devices.

The spectral response is measured by illuminating the top surface of the device with light emitted from a tungsten lamp through a monochromator. A graph of the relative spectral response for a device with a 3000 Å thick i-layer is given in FIG. 6 is for $d_2$ equal to 3000 Å and FWHM equal to 1400 Å. The curve 1 in the FIG. 6 is for a collector-emitter voltage of 5 V and for curve 2 it is 3 V.

It is well known that the spectral response of a phototransistor exhibits fall off at both the long wave lengths region and the short wavelengths region. Generally, the former is due to small absorption coefficient of the material used, and the latter is limited by the bandgap of the window material.

Through a detailed analysis, it is found that the spectral response of amorphous heterojunction phototransistor can be adjusted by varying the collector-base undoped layer thickness and applied voltage magnitudes.

I claim:

1. A method of fabricating a Si/SIC amorphous heterojunction phototransistor, by plasma enhanced chemical vapor deposition, comprising:
    cleaning a substrate selected from the group consisting of an ITO coated glass plate and an ITO coated insulator, with a sheet resistance of about 50 Ω/□;
    heating said substance to a temperature of about 250° C. for about 60 minutes and depositing the following layers by plasma enhanced chemical vapor deposition;
    depositing an n-type a-SiC:H layer about 100 Å thick on said substrate;
    depositing a first undoped a-Si:H layer having a thickness of between about 2000 and 7000 Å on said n-type a-SiC:H layer;
    depositing a p-type a-SiC:H base layer of about 100 Å thick on said first undoped layer;
    depositing a second undoped a-SiC:H layer about 160 Å thick on said base layer; and
    depositing an n-type a-SiC:H layer about 300 Å thick on said undoped layer.

2. The method of fabricating a Si/SiC amorphous heterojunction phototransistor set forth in claim 1, wherein in said plasma enhanced chemical vapor deposition a SiH$_4$ (0.45 parts by volume)+CH$_4$ (0.55 parts by volume) gas mixture is employed to grow said a-SiC:H layer.

3. The method of fabricating a Si/SiC amorphous heterojunction phototransistor set forth in claim 1, wherein in said plasma enhanced chemical vapor deposition a gas mixture comprising 75% by volume hydrogen and 25% by volume silane gas is used for a-Si:H deposition.

4. The method of fabricating a Si/SiC amorphous heterojunction phototransistor set forth in claim 4, wherein the R.F. power is about 40 watts during a-Si:H deposition.

5. The method of fabricating a Si/SiC amorphous heterojunction phototransistor set forth in claim 1, wherein in said plasma enhanced chemical vapor deposition the chamber pressure is about 1 torr.

6. The method of fabricating a Si/SiC amorphous heterojunction phototransistor set forth in claim 1, wherein said ITO coated substrate has a resistance of 50 Ω/□, before said plasma enhanced chemical vapor deposition said substrate is heated to a temperature of about 250° for about 60 minutes, said base layer has a thickness of about 100 Å, said second undoped layer has a thickness of about 160 Å, said emitter layer is about 300 Å thick, in said plasma enhanced chemical vapor deposition a SiH$_4$ (0.45 parts by volume)+CH$_4$ (0.55 parts by volume) gas mixture is employed to grow said a-SiC:H film, in said plasma enhanced chemical vapor deposition a gas mixture comprising 75% by volume hydrogen and 25% by volume silane gas is used for a-Si:H deposition, the R.F. power is about 40 watts during a-Si:H deposition, and in said plasma enhanced chemical vapor deposition the chamber pressure is about 1 torr.

* * * * *